United States Patent
Grellat et al.

(10) Patent No.: US 11,959,957 B2
(45) Date of Patent: Apr. 16, 2024

(54) MEASURING DEVICE FOR A MOTOR VEHICLE

(71) Applicant: Continental Automotive GmbH, Hannover (DE)

(72) Inventors: Laurent Grellat, Toulouse (FR); Mathieu Fiquet, Toulouse (FR); Laurent Vaysset, Toulouse (FR)

(73) Assignee: Continental Automotive GmbH (DE)

( * ) Notice: Subject to any disclaimer, the term of this patent is extended or adjusted under 35 U.S.C. 154(b) by 235 days.

(21) Appl. No.: 17/635,481

(22) PCT Filed: Sep. 17, 2020

(86) PCT No.: PCT/EP2020/076013
§ 371 (c)(1),
(2) Date: Feb. 15, 2022

(87) PCT Pub. No.: WO2021/053090
PCT Pub. Date: Mar. 25, 2021

(65) Prior Publication Data
US 2022/0334163 A1    Oct. 20, 2022

(30) Foreign Application Priority Data
Sep. 19, 2019 (FR) ...................... 1910333

(51) Int. Cl.
*G01R 31/00* (2006.01)
*G01K 1/02* (2021.01)
(Continued)

(52) U.S. Cl.
CPC ........... *G01R 31/006* (2013.01); *G01K 1/026* (2013.01); *G01K 7/183* (2013.01); *G01R 17/02* (2013.01)

(58) Field of Classification Search
CPC .... G01R 1/203; G01R 35/005; G01R 33/093; G01R 17/105
See application file for complete search history.

(56) References Cited

U.S. PATENT DOCUMENTS

2006/0145690 A1* 7/2006 Shoji ...................... B82Y 25/00
                                              324/207.21
2008/0084205 A1* 4/2008 Zimmer ................ B82Y 25/00
                                              374/185
(Continued)

FOREIGN PATENT DOCUMENTS

DE    102011079098 A1    1/2013
JP    2007085798 A       4/2007

OTHER PUBLICATIONS

International Search Report and Written Opinion for International Application No. PCT/EP2020/076013, dated Nov. 24, 2020, with partial English translation, 7 pages.
(Continued)

*Primary Examiner* — Jermele M Hollington
*Assistant Examiner* — Temilade S Rhodes-Vivour
(74) *Attorney, Agent, or Firm* — Buchanan Ingersoll & Rooney PC (57) ABSTRACT

The invention concerns a device (1) for measuring at least one parameter of a motor vehicle, the device (1) comprising at least one reference resistor ($R_0$) of a predetermined value and at least two measuring branches (K1, K2), each of the two measuring branches comprising at least a first element comprising a resistor ($R_0$) or a resistive sensor ($R_2$), capable of being connected to a voltage supply (Vcc), and a second element comprising a resistor or a resistive sensor ($R_1$, $R_3$) capable of being connected to earth (M), the first element and the second element being connected together at a mid-point (A, B), the mid-points (A, B) of the at least two
(Continued)

measuring branches (K1, K2) being connected together in pairs by a third element comprising a resistor or a resistive sensor ($R_4$).

9 Claims, 3 Drawing Sheets

(51) Int. Cl.
*G01K 7/18* (2006.01)
*G01R 17/02* (2006.01)

(56) References Cited

U.S. PATENT DOCUMENTS

| | | | |
|---|---|---|---|
| 2010/0045286 A1* | 2/2010 | Hotz | G01R 15/207 |
| | | | 324/260 |
| 2019/0154605 A1 | 5/2019 | Schmidt et al. | |

OTHER PUBLICATIONS

International Search Report and Written Opinion for International Application No. PCT/EP2020/076013, dated Nov. 24, 2020, 11 pages (French).
English Translation of Written Opinion for International Application No. PCT/EP2020/076013, dated Nov. 24, 2020, 6 pages.

* cited by examiner

MEASURING DEVICE FOR A MOTOR VEHICLE

CROSS REFERENCE TO RELATED APPLICATIONS

This application is the U.S. National Phase Application of PCT International Application No. PCT/EP2020/076013, filed Sep. 17, 2020, which claims priority to French Patent Application No. 1910333, filed Sep. 19, 2019, the contents of such applications being incorporated by reference herein.

FIELD OF THE INVENTION

The present invention relates to the automotive field, and more particularly to a device and a method for measuring a parameter in a motor vehicle using one or more "resistive" sensors, such as for example a temperature sensor or pressure sensor. The invention aims in particular to simplify the existing architectures of resistive sensors.

BACKGROUND OF THE INVENTION

In a motor vehicle, it is known practice to measure certain parameters such as temperature or pressure in order to be able to manage certain functions of the vehicle. In one known solution, these measurements are performed using a device in the form of a printed circuit board (or PCB) comprising a plurality of resistive sensors connected to a control circuit for interpreting the measurements.

Thus, for example, it is known practice to measure the temperature at an induction charger in order to be able to stop the operation thereof in the event of overheating, in particular when a metallic object is located nearby. By way of example, a coin placed on the induction charging support during operation receives the heat generated by the charger, thereby possibly exhibiting a risk of burning a user of the vehicle who might come into contact with the coin. In the case of an induction charger, the resistive sensors are temperature sensors distributed over the printed circuit board that is positioned above the antennas of the charger.

Figure 1:
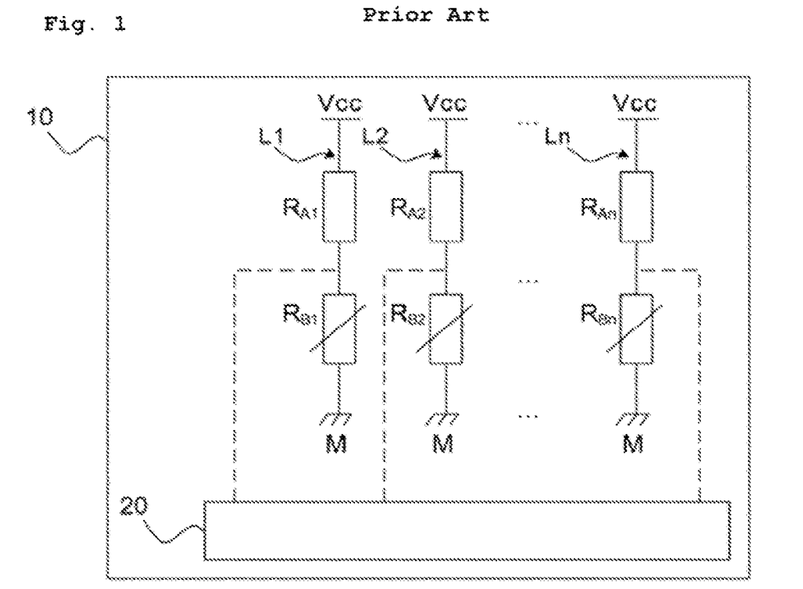
FIG. 1 schematically illustrates one embodiment of a measuring device from the prior art, comprising a plurality of measuring branches independent of one another.

In order to enable the measurements, in one known solution, one example of which is illustrated in FIG. 1, each resistive sensor $R_{B1}$, $R_{B2}$, ..., $R_{Bn}$ of the device 10 is connected in series with a resistor $R_{A1}$, $R_{A2}$, ..., $R_{An}$ in order to form a measuring branch $L_1$, $L_2$, ..., $L_n$ whose end on the resistor side $R_{A1}$, $R_{A2}$, ..., $R_{An}$ is connected to a voltage supply Vcc and whose end on the resistive sensor side $R_{B1}$, $R_{B2}$, ..., $R_{Bn}$ is connected to a ground M, the resistor $R_{A1}$, $R_{A2}$, ..., $R_{An}$ and the resistive sensor $R_{B1}$, $R_{B2}$, ..., $R_{Bn}$ being connected at a point called a "center tap". The measurements are collected by a control circuit 20 that is connected to the center tap of each measuring branch $L_1$, $L_2$, ..., $L_n$.

In this known solution, it is necessary to use as many connections between the control circuit 20 and the resistive sensors $R_{B1}$, $R_{B2}$, ..., $R_{Bn}$ as there are measuring branches $L_1$, $L_2$, ..., $L_n$, and therefore as there are time or pressure measurements to be performed, thereby possibly making the device 10 both complex and lengthy and expensive to manufacture.

There is therefore a need for a solution for a measuring device 10 that makes it possible to at least partially overcome these drawbacks.

SUMMARY OF THE INVENTION

To this end, an aspect of the invention relates firstly to a device for measuring at least one parameter of a motor vehicle, said device comprising at least one reference resistor of a predetermined value and at least two measuring branches, each of said at least two measuring branches comprising at least a first element comprising a resistor or a resistive sensor, able to be connected to a voltage supply, and a second element comprising a resistor or a resistive sensor able to be connected to a ground, the first element and the second element being connected to one another at a center tap, the center taps of the at least two measuring branches being connected to one another in pairs by a third element comprising a resistor or a resistive sensor.

The device according to an aspect of the invention makes it possible to perform voltage measurements at each center tap of the measuring branches in various connection configurations of the one or more other center taps, so as to determine the measurement of the parameter measured by each of the sensors of the device. The device thus makes it possible to increase the number of sensors while at the same time limiting the number of connections between the system of sensors and a control module for determining the measurements of the sensors from the voltages measured at the center taps in the various configurations. By increasing the number of sensors while at the same time limiting the number of connections, the complexity and the cost of the device are therefore limited in comparison with the prior-solution described above, thereby making it possible both to reduce cost and manufacturing time while at the same time simplifying the process of manufacturing said device. One obvious solution proceeding from the prior art would have been to use a multiplexer to group the connections of the sensors into a single output connection to the control module, but the cost of such a component would have increased the cost of the device and would not have allowed the manufacturing process thereof to be simplified.

According to one aspect of the invention, the maximum number Nb of resistive sensors is given by the following equation:

[Math. 1]

$$Nb = \left((n+1) \times \frac{(n+2)}{2}\right) - 2,$$

where n is the number of measuring branches K1, ..., Kn.

Preferably, the device comprises a control module able to:
connect the center tap of the second measuring branch to the voltage supply or to ground (or apply the voltage supply or ground to the center tap of the second measuring branch),
measure the value of the voltage defined between the center tap of the first measuring branch and ground,
calculate the resistance value of the first resistive sensor and the resistance value of the fourth resistive sensor from:
   a voltage value measured between the center tap of the first measuring branch and ground when the center tap of the second measuring branch is connected to the voltage supply,
   a voltage value measured between the center tap of the first measuring branch and ground when the center tap of the second measuring branch is connected to ground,
   a value of the supply voltage, and
   the predetermined value of the reference resistor,
determine the measurement of the parameter measured by the first resistive sensor and the fourth resistive sensor, connect the center tap of the first measuring branch to the voltage supply or to ground (or apply the voltage supply or ground to the center tap of the second measuring branch), measure the value of the voltage defined between the center tap of the second measuring branch and ground, calculate the resistance value of the second resistive sensor and the resistance value of the third resistive sensor from:
- a voltage value measured between the center tap of the second measuring branch and ground when the center tap of the first measuring branch is connected to the voltage supply,
- a voltage value measured between the center tap of the second measuring branch and ground when the center tap of the first measuring branch is connected to ground,
- a value of the supply voltage and
- a resistance value of the fourth resistive sensor, and determine the measurement of the parameter measured by the second resistive sensor and the third resistive sensor.

Preferably, the device comprises a single reference resistor.

Again preferably, the device comprises at least two resistive sensors.

Advantageously, each measuring branch comprises at least one resistive sensor.

Again advantageously, the second element of each measuring branch is a resistive sensor.

In one embodiment, the first element consists of a resistor or of a resistive sensor.

In one embodiment, the second element consists of a resistor or of a resistive sensor.

In one embodiment, the third element consists of a resistor or of a resistive sensor.

An aspect of the invention also relates to a motor vehicle comprising a device as presented above.

An aspect of the invention also relates to a method for measuring one or more parameters of resistive sensors in a motor vehicle, said method being implemented by a device as presented above installed in said vehicle and comprising the steps of:

connecting the center tap of the second measuring branch to the voltage supply, measuring the value of the voltage defined between the center tap of the first measuring branch and ground, connecting the center tap of the second measuring branch to ground, measuring the value of the voltage defined between the center tap of the first measuring branch and ground, calculating the resistance value of the first resistive sensor and the resistance value of the fourth resistive sensor from the voltage value measured between the center tap of the first measuring branch and ground when the center tap of the second measuring branch is connected to the voltage supply, the voltage value measured between the center tap of the first measuring branch and ground when the center tap of the second measuring branch is connected to ground, the value of the supply voltage and the predetermined value of the reference resistor, connecting the center tap of the first measuring branch to the voltage supply, measuring the value of the voltage defined between the center tap of the second measuring branch and ground, connecting the center tap of the first measuring branch to ground, measuring the value of the voltage defined between the center tap of the second measuring branch and ground, calculating the resistance value of the second resistive sensor and the resistance value of the third resistive sensor from the voltage value measured between the center tap of the second measuring branch and ground when the center tap of the first measuring branch is connected to the voltage supply, the voltage value measured between the center tap of the second measuring branch and ground when the center tap of the first measuring branch is connected to ground, the calculated resistance value of the fourth resistive sensor and the value of the supply voltage, determining the measurement of the parameter measured by the first resistive sensor, the second resistive sensor, the third resistive sensor and the fourth resistive sensor.

BRIEF DESCRIPTION OF THE DRAWINGS

Other features and advantages of aspects of the invention will become more clearly apparent on reading the description that follows. This description is purely illustrative and should be read with reference to the appended drawings, in which.

DETAILED DESCRIPTION OF THE EMBODIMENTS

The measuring device according to an aspect of the invention is intended to be installed in a motor vehicle in order to measure values of parameters such as for example temperature, pressure, amount of light, intensity of the light, a parameter of a piezoelectric sensor or any other parameter liable to vary the resistivity of what is known as a "resistive" sensor. In other words, the resistive sensors used in an aspect of the invention may for example be temperature sensors, pressure sensors, amount of light measurement sensors, light intensity measurement sensors, piezoelectric sensors, etc. In the device according to an aspect of the invention, the resistive sensors may be of the same kind, for example only temperature sensors or pressure sensors, or of different kinds, that is to say a mixture of sensors of different types (temperature sensor, pressure sensor, etc.).

The device according to an aspect of the invention comprises at least one reference resistor, at least two measuring branches and at least one control module.

Each of said two measuring branches comprises at least a first element comprising a resistor or a resistive sensor, able to be connected to a voltage supply, and a second element comprising a resistor or a resistive sensor able to be connected to a ground. The first element and the second element are connected to one another at a center tap, the center taps of the at least two measuring branches being connected to one another in pairs by a third element comprising a resistor or a resistive sensor.

Figure 2:
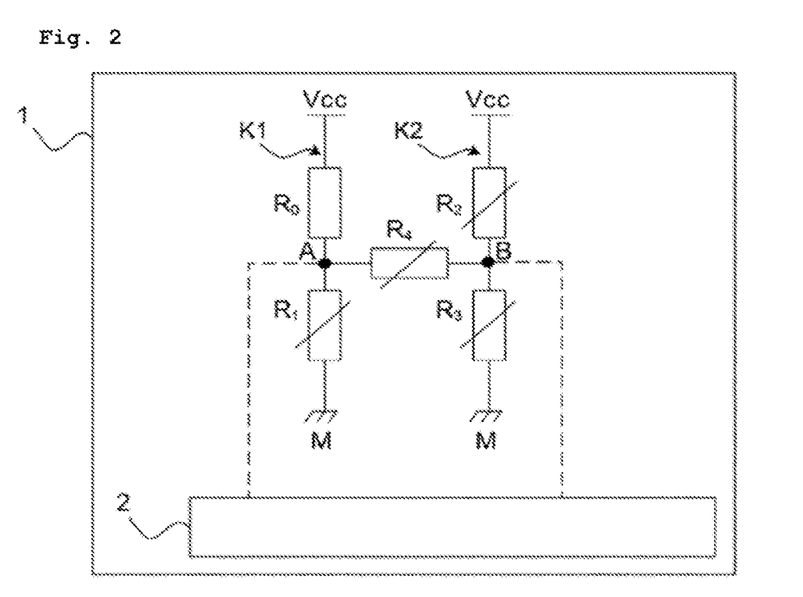
FIG. 2 is a circuit diagram of one embodiment of a measuring device according to the invention comprising two measuring branches and a total of four sensors.

FIG. 2 shows a first example of an electrical circuit modeling the measuring device 1 when said device 1 is installed in a motor vehicle. The electrical circuit comprises, in addition to the control module 2, two measuring branches K1, K2.

The first measuring branch K1 comprises a resistor $R_0$ and a first resistive sensor $R_1$ that are connected at a point called a "center tap" A. The resistor $R_0$ is also electrically connected to a voltage supply Vcc, while the first resistive sensor $R_1$ is also connected to a ground M. The resistor $R_0$ constitutes the reference resistor of the circuit, and its value is known to the control module 2.

The second measuring branch K2 comprises a second resistive sensor $R_2$, connected on the one hand to the voltage supply Vcc and on the other hand to a center tap B, and a third resistive sensor $R_3$, connected on the one hand to said center tap B and on the other hand to ground M.

The first measuring branch K1 and the second measuring branch K2 are connected at their respective center taps A, B by a fourth resistive sensor $R_4$.

Figure 3:
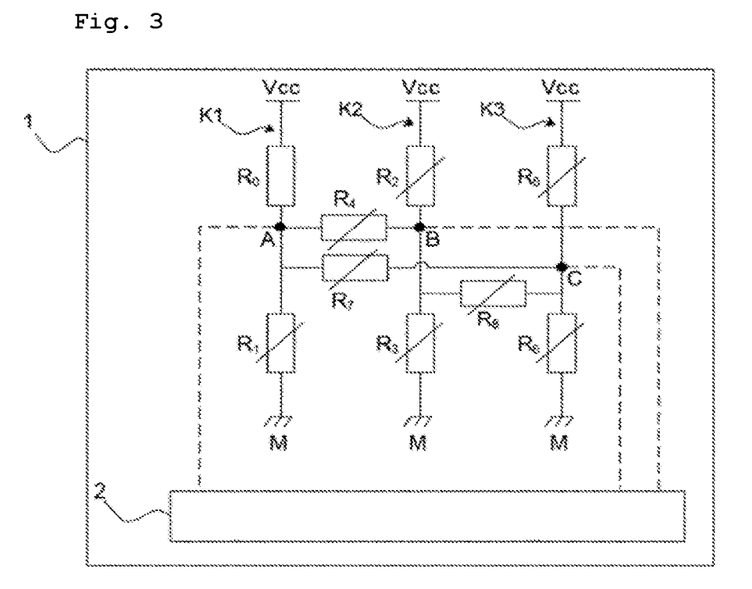
FIG. 3 is a circuit diagram of one embodiment of a measuring device according to the invention comprising three measuring branches and a total of eight sensors.

FIG. 3 shows a second example of an electrical circuit modeling the measuring device 1 when said device 1 is installed in a motor vehicle. The electrical circuit comprises, in addition to the control module 2, three measuring branches K1, K2, K3.

The first measuring branch K1 comprises a resistor $R_0$ and a first resistive sensor $R_1$ that are connected at a center tap A. The resistor $R_0$ is also electrically connected to a voltage supply Vcc, while the first resistive sensor $R_1$ is also connected to a ground M. The resistor $R_0$ constitutes the reference resistor of the circuit, and its value is known to the control module 2.

The second measuring branch K2 comprises a second resistive sensor $R_2$, connected on the one hand to the voltage supply Vcc and on the other hand to a center tap B, and a third resistive sensor $R_3$, connected on the one hand to said center tap B and on the other hand to ground M.

The first measuring branch K1 and the second measuring branch K2 are connected at their respective center taps A, B by a fourth resistive sensor $R_4$.

The third measuring branch K3 comprises a fifth resistive sensor $R_5$, connected on the one hand to the voltage supply Vcc and on the other hand to a center tap C, and a sixth resistive sensor $R_6$, connected on the one hand to said center tap C and on the other hand to ground M.

The first measuring branch K1 and the third measuring branch K3 are connected at their respective center taps A, C by a seventh resistive sensor $R_7$.

The second measuring branch K2 and the third measuring branch K3 are connected at their respective center taps B, C by an eighth resistive sensor $R_8$.

Figure 4:
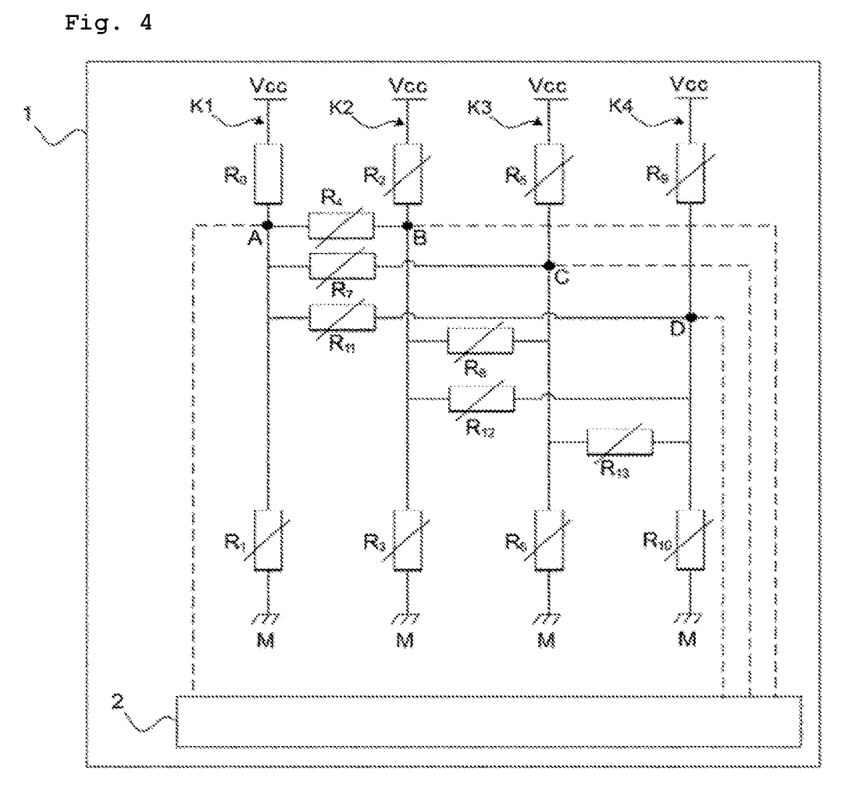
FIG. 4 is a circuit diagram of one embodiment of a measuring device according to the invention comprising four measuring branches and a total of thirteen sensors.

FIG. 4 shows a third example of an electrical circuit modeling the measuring device 1 when said device 1 is installed in a motor vehicle. The electrical circuit comprises, in addition to the control module 2, four measuring branches K1, K2, K3, K4.

The first measuring branch K1 comprises a resistor $R_0$ and a first resistive sensor $R_1$ that are connected at a center tap A of said first branch K1. The resistor $R_0$ is also electrically connected to a voltage supply Vcc, while the first resistive sensor $R_1$ is also connected to a ground M. The resistor $R_0$ constitutes the reference resistor of the circuit, and its value is known to the control module 2.

The second measuring branch K2 comprises a second resistive sensor $R_2$, connected on the one hand to the voltage supply Vcc and on the other hand to a center tap B of said second measuring branch K2, and a third resistive sensor $R_3$, connected on the one hand to said center tap B and on the other hand to ground M.

The first measuring branch K1 and the second measuring branch K2 are connected at their respective center taps A, B by a fourth resistive sensor $R_4$.

The third measuring branch K3 comprises a fifth resistive sensor $R_5$, connected on the one hand to the voltage supply Vcc and on the other hand to a center tap C of said third measuring branch K3, and a sixth resistive sensor $R_6$, connected on the one hand to said center tap C and on the other hand to ground M.

The first measuring branch K1 and the third measuring branch K3 are connected at their respective center taps A, C by a seventh resistive sensor $R_7$.

The second measuring branch K2 and the third measuring branch K3 are connected at their respective center taps B, C by an eighth resistive sensor $R_8$.

The fourth measuring branch K4 comprises a ninth resistive sensor $R_9$, connected on the one hand to the voltage supply Vcc and on the other hand to a center tap D of said fourth measuring branch K4, and a tenth resistive sensor $R_{10}$, connected on the one hand to said center tap D and on the other hand to ground M.

The first measuring branch K1 and the fourth measuring branch K4 are connected at their respective center taps A, D by an eleventh resistive sensor $R_{11}$.

The second measuring branch K2 and the fourth measuring branch K4 are connected at their respective center taps B, D by a twelfth resistive sensor $R_{12}$.

Finally, the third measuring branch K3 and the fourth measuring branch K4 are connected at their respective center taps C, D by a thirteenth resistive sensor $R_{13}$.

In the various embodiments, the control module 2 is able to measure the voltage between the center tap of each measuring branch K1, K2, K3, K4 and ground M.

Thus, in the configuration in the first example (FIG. 2), only two connections of the control module 20 to the center taps A and B are necessary to perform measurements with four resistive sensors $R_1$, $R_2$, $R_3$, $R_4$. In the configuration in the second example (FIG. 3), only three connections of the control module 20 to the center taps A, B and C are necessary to perform measurements with eight resistive sensors $R_1$, $R_2$, $R_3$, $R_4$, $R_5$, $R_6$, $R_7$, $R_8$. In the configuration in the third example (FIG. 4), only four connections of the control module 20 to the center taps A, B, C and D are necessary to perform measurements with thirteen resistive sensors $R_1$, $R_2$, $R_3$, $R_4$, $R_5$, $R_6$, $R_7$, $R_8$, $R_9$, $R_{10}$, $R_{11}$, $R_{12}$, $R_{13}$.

It should be noted that the device 1 could comprise fewer resistive sensors by replacing some sensors with resistors. Preferably, the resistor $R_0$ of the first measuring branch K1, connected between the voltage supply Vcc and the center tap A of the first measuring branch K1, always constitutes the reference resistor of the device 1, and its value is known to the control module 2. As a variant, another resistor, placed on another measuring branch, could constitute this reference resistor.

In other embodiments (not illustrated), the device 1 may comprise more than four branches K1, K2, K3, K4. In this case, the maximum number Nb of resistive sensors is given by the following equation:

[Math. 2]

$$Nb = \left((n+1) \times \frac{(n+2)}{2}\right) - 2,$$

where n is the number of measuring branches K1, . . . , Kn.

By way of example, the following table gives the value of the maximum number of resistive sensors Nb as a function of the number of measuring branches K1, . . . , Kn:

TABLE 1

| n | Nb |
|---|----|
| 2 | 4  |
| 3 | 8  |
| 4 | 13 |
| 5 | 19 |
| 6 | 26 |
| 7 | 34 |
| 8 | 43 |

The control module 2 is able to connect each center tap A, B, C, D of each measuring branch K1, K2, K3, K4 to the voltage supply Vcc or to ground M and to measure the voltage defined between each center tap A, B, C, D of each measuring branch K1, K2, K3, K4 and ground M in order to estimate the value of the measurements performed by the resistive sensors $R_1$, $R_2$, $R_3$, $R_4$, $R_5$, $R_6$, $R_7$, $R_8$, $R_9$, $R_{10}$, $R_{11}$, $R_{12}$, $R_{13}$, as will be described below.

The control module 2 is preferably in the form of a microcontroller or a processor able to implement a set of instructions for performing these functions.

An aspect of the invention will now be presented in terms of its implementation.

In the example of FIG. 2, the control module 2 will perform four voltage measurements in four different configurations.

First of all, the control module 2 connects the center tap B of the second measuring branch K2 to the voltage supply Vcc (or applies the voltage supply to the center tap B) in a step E1, and measures the voltage $V_A$ defined between the center tap A of the first measuring branch K1 and ground M in a step E2.

When the center tap B of the second measuring branch K2 is connected to the voltage supply Vcc, the resistor $R_0$ is connected in parallel with the fourth resistive sensor $R_4$, such that the voltage $V_A$ defined between the center tap A of the first measuring branch K1 and ground M is given by the following equation:

[Math. 3]

$$V_A = Vcc \times \left(\frac{R_1}{R_1 + \left(\frac{R_0 \times R_4}{R_0 + R_4}\right)}\right), \quad (1)$$

That is to say:

[Math. 4]

$$R_1 = \left(\frac{R_0 \times R_4}{R_0 + R_4}\right) \times \left(\frac{V_A}{Vcc - V_A}\right), \quad (2)$$

Next, the control module 2 connects the center tap B of the second measuring branch K2 to ground M in a step E3, and measures the voltage $V'_A$ defined between the center tap A of the first measuring branch K1 and ground M in a step E4.

When the center tap B of the second measuring branch K2 is connected to ground M, the first resistive sensor $R_1$ is connected in parallel with the fourth resistive sensor $R_4$, such that the voltage $V'_A$ defined between the center tap A of the first measuring branch K1 and ground M is given by the following equation:

[Math. 5]

$$V'_A = Vcc \times \left(\frac{\left(\frac{R_1 \times R_4}{R_1 + R_4}\right)}{R_0 + \left(\frac{R_1 \times R_4}{R_1 + R_4}\right)}\right), \quad (3)$$

Substituting $R_1$, given by equation (2) above, into this last equation (3) gives:

[Math. 6]

$$R_4 = R_0 \times \left(\frac{V'_A}{V'_A - V_A}\right), \quad (4)$$

Therefore, knowing the value of the reference resistor $R_0$ and the two voltage values
[Math. 7],
$V_A$ and
[Math. 8],
$V'_A$ measured between the center tap A of the first measuring branch K1 and ground M, respectively in steps E2 and E4, the control module 2 calculates the resistance value of the fourth resistive sensor $R_4$ from equation (4) in a step E5, and then the resistance value of the first resistive sensor $R_1$ from equation (2) in a step E6.

Next, the control module 2 connects the center tap A of the first measuring branch K1 to the voltage supply Vcc in a step E7, and measures the voltage $V_B$ defined between the center tap B of the second measuring branch K2 and ground M in a step E8.

When the center tap A of the first measuring branch K1 is connected to the voltage supply Vcc, the second resistive sensor $R_2$ is connected in parallel with the fourth resistive sensor $R_4$, such that the voltage $V_B$ defined between the center tap A of the second measuring branch K2 and ground M is given by the following equation:

[Math. 9]

$$V_B = Vcc \times \left(\frac{R_3}{R_3 + \left(\frac{R_2 \times R_4}{R_2 + R_4}\right)}\right), \quad (5)$$

That is to say:

[Math. 10]

$$R_3 = \left(\frac{R_2 \times R_4}{R_2 + R_4}\right) \times \left(\frac{V_B}{Vcc - V_B}\right), \quad (6)$$

Next, the control module 2 connects the center tap A of the first measuring branch K1 to ground M in a step E9, and measures the voltage $V'_B$ defined between the center tap B of the second measuring branch K2 and ground M in a step E10.

When the center tap B of the second measuring branch K2 is connected to ground M, the third resistive sensor $R_3$ is connected in parallel with the fourth resistive sensor $R_4$, such that the voltage $V'_B$ defined between the center tap B of the second measuring branch K2 and ground M is given by the following equation:

[Math. 11]

$$V'_B = Vcc \times \left( \frac{\left(\frac{R_3 \times R_4}{R_3 + R_4}\right)}{R_2 + \left(\frac{R_3 \times R_4}{R_3 + R_4}\right)} \right), \quad (7)$$

Substituting $R_1$, given by equation (6) above, into this last equation (7) gives:

[Math. 12]

$$R_2 = R_4 \times \left(\frac{V_B - V'_B}{V'_B}\right), \quad (8)$$

Therefore, knowing the resistance value of the fourth resistive sensor $R_4$ calculated in reference step E5 and the two voltage values
[Math. 13],
$V_B$ and
[Math. 14],
$V'_B$ measured between the center tap B of the second measuring branch K2 and ground M, respectively in steps E7 and E9, the control module 2 calculates the resistance value of the second resistive sensor $R_2$ from equation (8) in a step E11, and then the resistance value of the third resistive sensor $R_3$ from equation (6) in a step E12.

Figure 5:
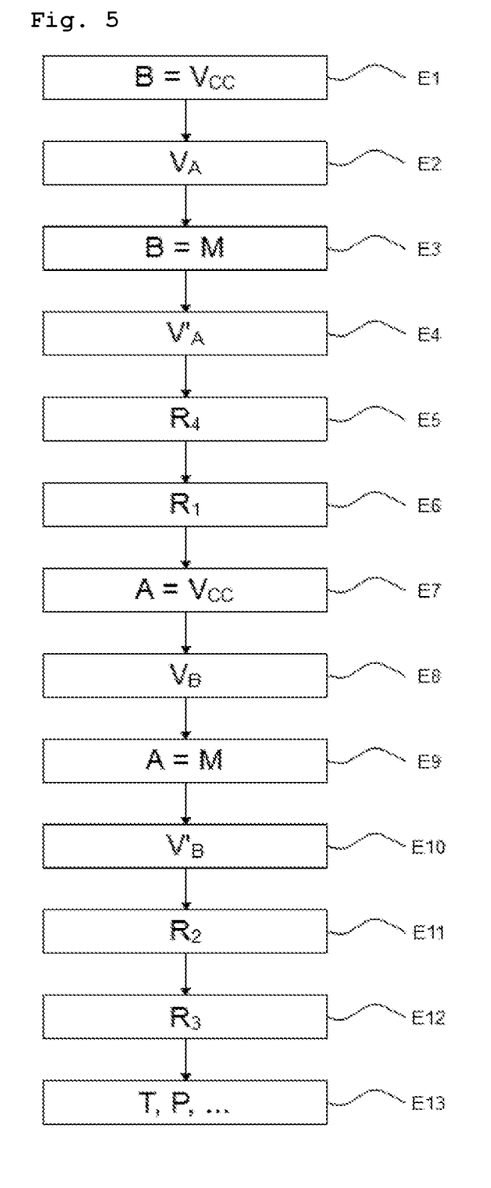
FIG. 5 schematically illustrates one embodiment of the method according to the invention.

The control module 2 determines, in a step E13, in a manner known per se, the value of the measurement of the parameter (temperature, pressure, etc.) measured by the first resistive sensor $R_1$, the second resistive sensor $R_2$, the third resistive sensor $R_3$ and the fourth resistive sensor $R_4$ from their respective resistance values calculated in steps E5, E6, E11 and E12.

Successively measuring the voltage values at the center taps A, B of the first measuring branch K1 and of the second measuring branch B in the four configurations therefore makes it possible to solve a system of four equations with four unknowns in order to obtain a resistance value for each of the four resistive sensors $R_1$, $R_2$, $R_3$, $R_4$ from a single reference resistor. Preferably, the successive measurements are performed rapidly, for example over a time interval with a duration of a few milliseconds, in order to prevent the one or more measured parameters (temperature, pressure, etc.) changing during the duration of said measurements.

The circuit in the example of FIG. 2 therefore makes it possible to measure the parameter values of four resistive sensors $R_1$, $R_2$, $R_3$, $R_4$ from only two connection points between the electrical circuit comprising said resistive sensors $R_1$, $R_2$, $R_3$, $R_4$ and the control module 2.

The resistance values of the resistive sensors in the examples of FIGS. 3 and 4 may be calculated in a manner similar to those in the example of FIG. 2 by obtaining, respectively, systems of eight and thirteen equations with eight and thirteen unknowns, which may be solved by measuring the voltage defined between each center tap of each branch in various configurations (center tap connected to the supply voltage or to ground).

The device and the method according to an aspect of the invention therefore make it possible to reduce the number of connections required between the measuring branches and the control module in comparison with a prior-art solution in which each sensor required a measuring branch and a resistor, thus reducing the cost and the complexity of the device while at the same time simplifying the manufacturing process.

The invention claimed is:

1. A device for measuring at least one parameter of a motor vehicle, said device comprising at least one reference resistor of a predetermined value and at least two measuring branches, each of said at least two measuring branches comprising at least a first element comprising a resistor or a resistive sensor, able to be connected to a voltage supply, and a second element comprising a resistor or a resistive sensor able to be connected to a ground, the first element and the second element being connected to one another at a center tap, the center taps of the at least two measuring branches being connected to one another in pairs by a third element comprising a resistor or a resistive sensor, said device comprising a control module able to:
   a) connect the center tap of the second measuring branch to the voltage supply or to ground,
   b) measure the value of the voltage defined between the center tap of the first measuring branch and ground,
   c) calculate the resistance value of the first resistive sensor and the resistance value of the fourth resistive sensor from:
   d) a voltage value measured between the center tap of the first measuring branch and ground when the center tap of the second measuring branch is connected to the voltage supply,
   e) a voltage value measured between the center tap of the first measuring branch and ground when the center tap of the second measuring branch is connected to ground,
   f) a value of the supply voltage and
   g) the predetermined value of the reference resistor,
   h) determine the measurement of the parameter measured by the first resistive sensor and the fourth resistive sensor,
   i) connect the center tap of the first measuring branch to the voltage supply or to ground,
   j) measure the value of the voltage defined between the center tap of the second measuring branch and ground,
   k) calculate the resistance value of the second resistive sensor and the resistance value of the third resistive sensor from:
   l) a voltage value measured between the center tap of the second measuring branch and ground when the center tap of the first measuring branch is connected to the voltage supply,
   m) a voltage value measured between the center tap of the second measuring branch and ground when the center tap of the first measuring branch is connected to ground,
   n) a value of the supply voltage and
   o) a resistance value of the fourth resistive sensor,
   p) determine the measurement of the parameter measured by the second resistive sensor and the third resistive sensor.

2. The device as claimed in claim 1, the maximum number of resistive sensors being given by the following equation:

$$Nb = \left((n+1) \times \frac{(n+2)}{2}\right) - 2$$

where n is the number of measuring branches (K1, ... Kn).

3. The device as claimed in claim 1, said device comprising a single reference resistor.

4. The device as claimed in claim 1, said device comprising at least two resistive sensors.

5. The device as claimed in claim 1, wherein each measuring branch comprises at least one resistive sensor.

6. The device as claimed in claim 1, wherein the second element of each measuring branch is a resistive sensor.

7. The device as claimed in claim 1, wherein the first element consists of a resistor or of a resistive sensor and the second element consists of a resistor or of a resistive sensor.

8. A motor vehicle comprising a device as claimed in claim 1.

9. A method for measuring one or more parameters of resistive sensors in a motor vehicle, said method being implemented by a device as claimed in claim 1 installed in said vehicle and said method comprising:
connecting the center tap of the second measuring branch to the voltage supply,
measuring the value of the voltage defined between the center tap of the first measuring branch and ground,
connecting the center tap of the second measuring branch to ground,
measuring the value of the voltage defined between the center tap of the first measuring branch and ground,
calculating the resistance value of the first resistive sensor and the resistance value of the fourth resistive sensor from the voltage value measured between the center tap of the first measuring branch and ground when the center tap of the second measuring branch is connected to the voltage supply, the voltage value measured between the center tap of the first measuring branch and ground when the center tap of the second measuring branch is connected to ground, the value of the supply voltage and the predetermined value of the reference resistor,
connecting the center tap of the first measuring branch to the voltage supply,
measuring the value of the voltage defined between the center tap of the second measuring branch and ground,
connecting the center tap of the first measuring branch to ground,
measuring the value of the voltage defined between the center tap of the second measuring branch and ground,
calculating the resistance value of the second resistive sensor and the resistance value of the third resistive sensor from the voltage value measured between the center tap of the second measuring branch and ground when the center tap of the first measuring branch is connected to the voltage supply, the voltage value measured between the center tap of the second measuring branch and ground when the center tap of the first measuring branch is connected to ground, the calculated resistance value of the fourth resistive sensor and the value of the supply voltage,
determining the measurement of the parameter measured by the first resistive sensor, the second resistive sensor, the third resistive sensor and the fourth resistive sensor.

* * * * *